United States Patent
Yeh et al.

(10) Patent No.: US 7,101,748 B2
(45) Date of Patent: Sep. 5, 2006

(54) METHOD OF INTEGRATING THE FORMATION OF A SHALLOW JUNCTION N CHANNEL DEVICE WITH THE FORMATION OF P CHANNEL, ESD AND INPUT/OUTPUT DEVICES

(75) Inventors: Yu-Lung Yeh, Kaohsiung (TW); Chu-We Hu, Taichung (TW); Li-Te Hsu, Tainan (TW); Pin-Chia Su, Tainan (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/788,170

(22) Filed: Feb. 26, 2004

(65) Prior Publication Data

US 2005/0191802 A1 Sep. 1, 2005

(51) Int. Cl.
*H01L 21/8238* (2006.01)
(52) U.S. Cl. .................................................. 438/200
(58) Field of Classification Search ................ 438/200, 438/201, 303, 587, 132, 215, 281, 333, 601; 257/368
See application file for complete search history.

(56) References Cited

U.S. PATENT DOCUMENTS

| | | | | |
|---|---|---|---|---|
| 5,534,723 A * | 7/1996 | Iwai et al. | ................... | 257/360 |
| 5,635,337 A * | 6/1997 | Bartha et al. | ............... | 430/323 |
| 5,911,105 A * | 6/1999 | Sasaki | ......................... | 438/258 |
| 5,990,060 A * | 11/1999 | Ohmi et al. | ................. | 510/175 |
| 6,069,031 A * | 5/2000 | Wu | ............................. | 438/197 |
| 6,069,033 A * | 5/2000 | Verhaar et al. | ............. | 438/201 |
| 6,187,619 B1 * | 2/2001 | Wu | ............................. | 438/224 |
| 6,359,314 B1 * | 3/2002 | Randazzo | .................... | 257/355 |
| 6,368,907 B1 * | 4/2002 | Doi et al. | .................... | 438/217 |
| 6,420,226 B1 * | 7/2002 | Chen et al. | ................. | 438/238 |
| 6,455,385 B1 | 9/2002 | Alvis et al. | ................. | 438/301 |
| 6,475,846 B1 * | 11/2002 | Marotta et al. | ............. | 438/201 |
| 6,509,221 B1 | 1/2003 | Doris et al. | ................. | 438/199 |
| 6,583,013 B1 * | 6/2003 | Rodder et al. | ............. | 438/276 |
| 6,639,287 B1 * | 10/2003 | Kitamura | .................... | 257/390 |
| 6,838,734 B1 * | 1/2005 | Ker et al. | .................... | 257/360 |
| 6,943,401 B1 | 9/2005 | Fang | | |
| 6,982,216 B1 | 1/2006 | Lee et al. | | |
| 2002/0127791 A1 * | 9/2002 | Nanjo et al. | ................. | 438/231 |
| 2002/0146878 A1 * | 10/2002 | Ohnakado et al. | .......... | 438/215 |
| 2003/0022445 A1 * | 1/2003 | Taniguchi et al. | .......... | 438/257 |
| 2003/0104320 A1 * | 6/2003 | Nguyen et al. | ............. | 430/313 |

* cited by examiner

*Primary Examiner*—Matthew Smith
*Assistant Examiner*—Lex H. Malsawma

(57) ABSTRACT

The fabrication an NMOS device featuring a shallow source/drain region, performed as part of an integrated process sequence employed to integrate the fabrication of other type devices with the fabrication of the NMOS device, has been developed. A critical feature of the integrated process sequence is the formation of the shallow source/drain region of the NMOS accomplished after formation of the other type devices, thus reducing the risk of exposure of the shallow source/drain region to possible damaging procedures used for the other type devices. In addition the process used to remove a photoresist shape, used to protect the completed other type devices from the shallow source/drain ion implantation procedure, has been modified again to reduce possible damage to the shallow source/drain region. The flow of $CF_4$ in the plasma tool during the photoresist removing plasma ashing procedure, as well as the length of the post-plasma ashing wet clean procedure, have both been reduced resulting in reduced exposure of the shallow source/drain region to these procedures.

9 Claims, 3 Drawing Sheets

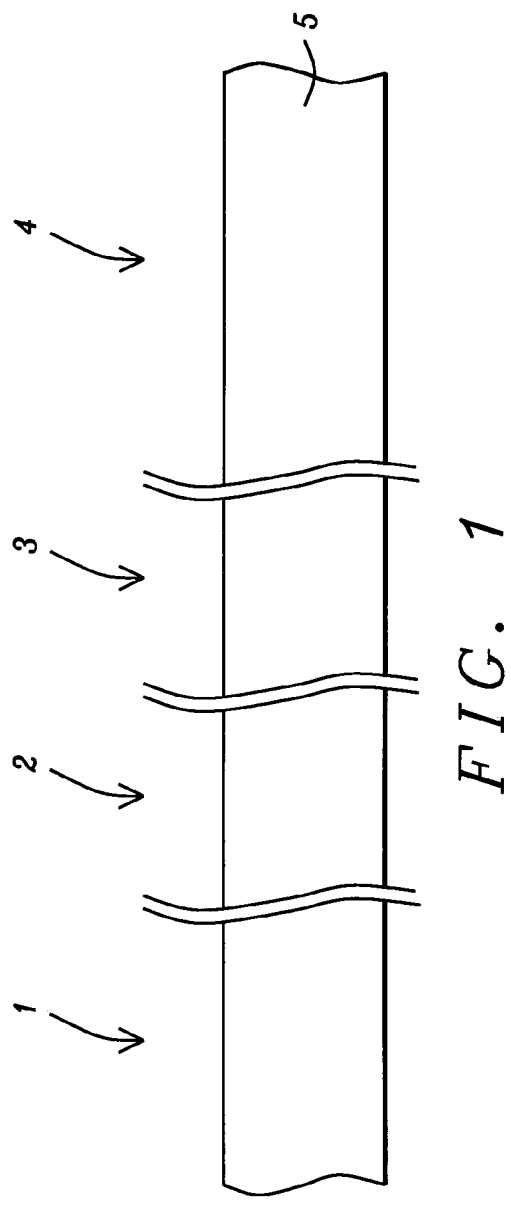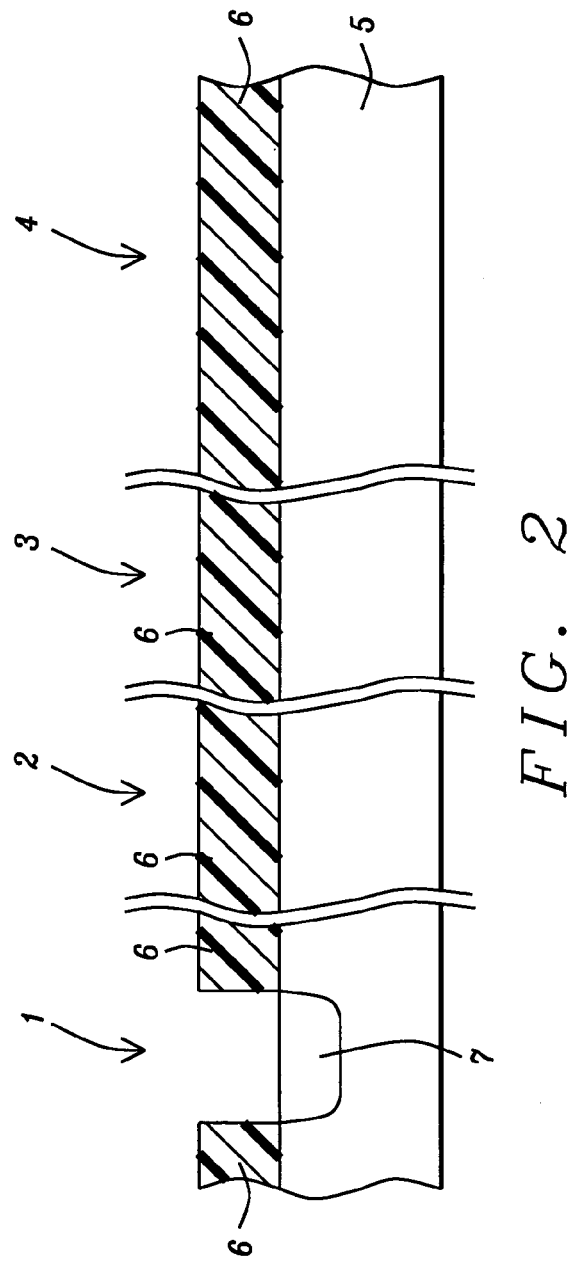

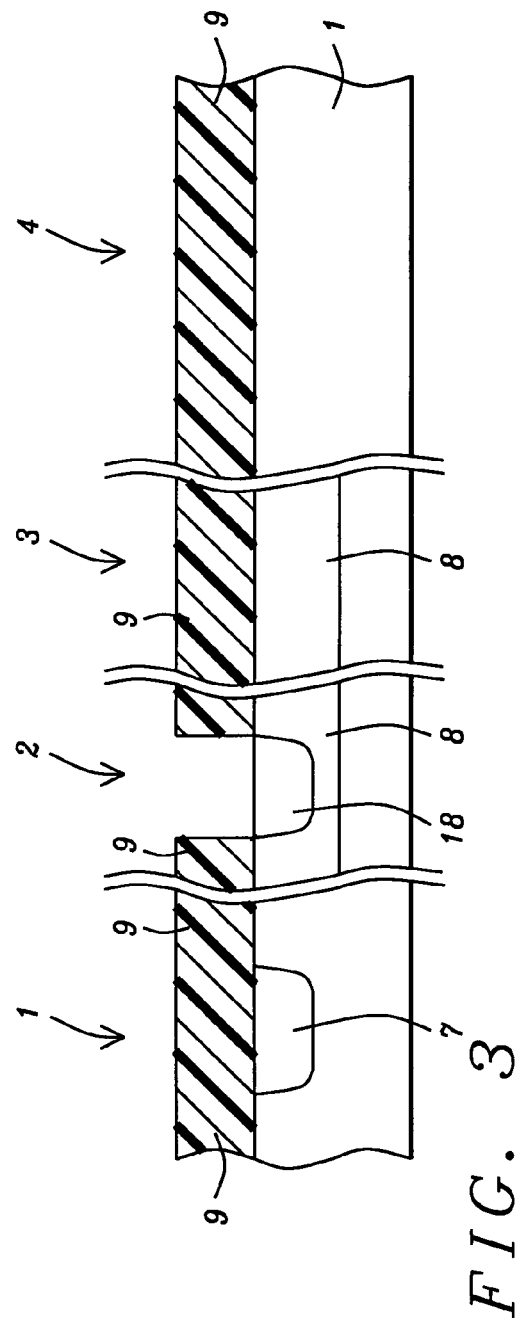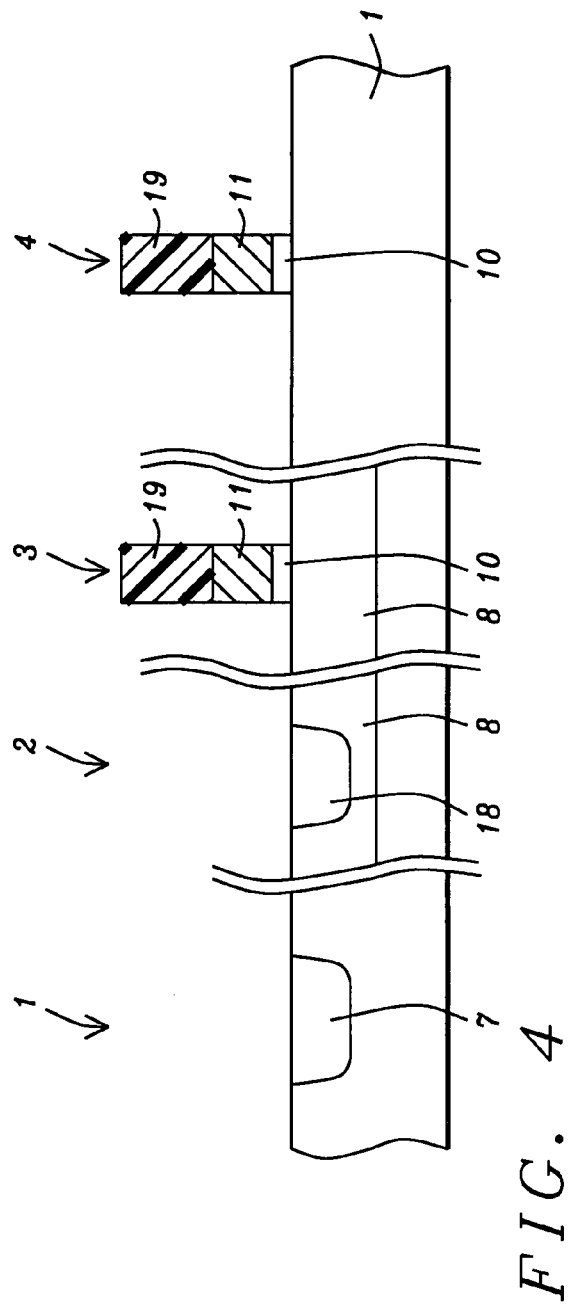

METHOD OF INTEGRATING THE FORMATION OF A SHALLOW JUNCTION N CHANNEL DEVICE WITH THE FORMATION OF P CHANNEL, ESD AND INPUT/OUTPUT DEVICES

BACKGROUND OF THE INVENTION (1) Field of the Invention

The present invention relates to methods used to fabricate semiconductor devices, and more specifically to a method used to integrate the formation of a shallow junction N channel metal oxide semiconductor field effect transistor (NMOS) device with the fabrication of other type devices, without damaging a shallow source/drain region of the NMOS device.

(2) Description of Prior Art

For performance enhancement as well as for fabrication cost reductions several different type devices are being incorporated in a single semiconductor chip. For example complimentary metal oxide semiconductor (CMOS) devices comprised with both NMOS as well as P channel metal oxide semiconductor (PMOS), devices, can be formed in an integrated process sequence that also allows the formation of an electro-static discharge (ESD) device to be realized. The increased communication between the devices, all located on the same semiconductor chip, results in less wiring and thus decreased resistance and increased performance when compared to counterpart configurations wherein all devices are not on the same semiconductor chip necessitating additional resistive interconnects. In addition fabrication costs are reduced via sharing of specific process steps during the fabrication of the devices.

The ability to obtain desired device characteristics for a specific device, such as an NMOS device used for logic or memory applications, can be influenced by the process sequence chosen for the fabrication of the various devices. For example an NMOS device to be used for logic applications can be designed as a narrow channel length device with a shallow source/drain region. To obtain a shallow source/drain region a low energy ion implantation procedure is employed placing N type dopants near the surface of a semiconductor substrate. If after the NMOS source/drain implantation step other process steps are employed for attainment of other type devices, a portion of the NMOS source/drain dopants located near the surface of the semiconductor substrate can be damaged or removed. This invention will teach a process sequence for the fabrication of several type devices on the same semiconductor chip featuring a source/drain region of an NMOS type device formed after specific process steps for the other type have already been performed. In addition specific process conditions employed after formation of the NMOS source/drain region are altered to reduce the risk of damage or removal of a portion of the already formed NMOS source/drain region. Prior art such as Alvis et al, in U.S. Pat. No. 6,455,385 B1, as well as Doris et al, in U.S. Pat. No. 6,509,221 B1, have described methods of forming CMOS devices as well as optimizing source/drain implantation conditions. However none of the prior art describe the novel process sequence and process steps featured in the present invention allowing the fabrication of a shallow source/drain NMOS device to be integrated with the fabrication of other device types such as a PMOS, a P type I/O and an ESD device.

SUMMARY OF THE INVENTION

It is an object of this invention to integrate the fabrication of a shallow source/drain NMOS device with the fabrication of other type devices such as a PMOS device, a P type I/O device, and an ESD device.

It is another object of this invention to perform the ion implantation procedure for the NMOS source/drain region after the process steps for the other type devices have been completed.

It is still another object of this invention to reduce the severity of the process steps employed after implantation of the shallow, NMOS source/drain region, to reduce the risk of damaging or removing portions of the shallow NMOS source/drain region.

In accordance with the present invention a method of integrating the fabrication of a shallow source/drain NMOS device with the fabrication of other type devices, wherein the risk of damage to, or removal of, portions of the NMOS source/drain region during subsequent process steps is reduced, is described. Formation of an ESD device is first accomplished on a first portion of a semiconductor substrate followed by formation of a P type I/O device on a second portion of the same semiconductor substrate. After growth of a gate insulator layer conductive gate structures are formed overlying the gate insulator layer. A fourth portion of the semiconductor substrate is protected by a photoresist shape while P type source/drain regions are formed in an area of a third portion of semiconductor substrate not protected by the conductive gate structure. After forming a photoresist shape to protect non-NMOS regions, a low energy ion implantation procedure is employed to form a shallow junction, N type source/drain region in an area of the fourth portion of semiconductor substrate not covered by the conductive gate structure. Subsequent processing such as photoresist shape removal, sidewall spacer formation, and wet clean procedures, are performed using conditions which reduce the risk of implanted NMOS source/drain regions from being damaged or removed.

BRIEF DESCRIPTION OF THE DRAWINGS

The object and other advantages of this invention are best described in the preferred embodiments with reference to the attached drawings that include:

FIGS. 1–6, which schematically in cross-sectional style show key stages of a process sequence used to integrate the formation of a shallow source/drain NMOS device, with the formation of other type devices.

DESCRIPTION OF THE PREFERRED EMBODIMENTS

Figure 5:
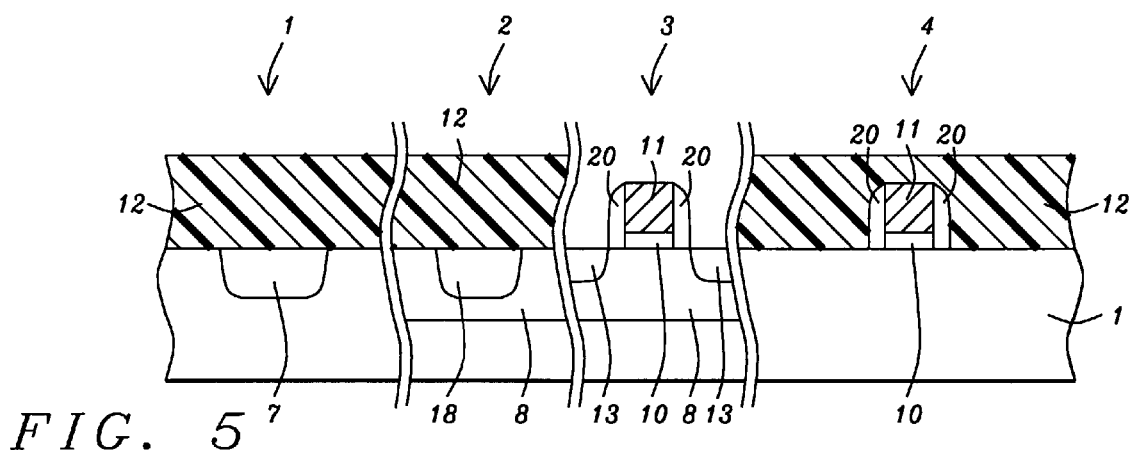

The process sequence and process steps used to integrate the formation of a shallow source/drain NMOS device, with the formation of other type devices, will now be described in detail. The other types of devices to be formed with the shallow source/drain NMOS device in the integrated process sequence will be an ESD device, an P type I/O device, and a PMOS device. If desired other type devices can be integrated with the formation of the shallow source/drain NMOS device, however the formation of the NMOS shallow source/drain region will be accomplished after completion of the other type devices. Semiconductor substrate 5, comprised of P type, single crystalline silicon featuring a <100> crystallographic orientation, is used an schematically shown in FIG. 1. Portion 1, of semiconductor substrate 5, will be used to accommodate an ESD device, portion 2, will be used to accommodate a P type I/O device, while portion 3, of semiconductor substrate 5, will be used to accommodate a PMOS device. The shallow source/drain NMOS device, to be completed after formation of the other type device will be fabricated in portion 4, of semiconductor substrate 5.

Photoresist shape 6, is formed to protect portions 2, 3 and 4, of semiconductor substrate 5, from processes use to form the ESD device in portion 1. An opening in photoresist shape 6, allows implantation of arsenic or phosphorous ions to form N type region 7, in an exposed region of portion 1, resulting in an ESD device comprised of N region 7, in P type semiconductor substrate 5. This is schematically shown in FIG. 2. Photoresist shape 6, is next removed via plasma oxygen ashing procedures, using $CF_4$ as a component of the ashing procedure.

A $P^+$ input/output (I/O), device is next formed in portion 2, of semiconductor substrate 5. The I/O device can be a P type, metal oxide semiconductor field effect transistor (MOSFET) device featuring a gate insulator layer and an overlying conductive gate structure. However for this description only $P^+$ region 18, a region such as a P type source/drain region of the MOSFET device will be described. Prior to formation of the $P^+$ I/O device in portion 2, of semiconductor substrate 5, N well region 8 is first formed in top regions of only portions 2, and 3. This is accomplished via photoresist block out of portions 1 and 4, prior to the implantation of arsenic or phosphorous ions at an energy between about 50 to 1000 KeV, at a dose between about 1E12 to 1E15 atoms/$cm^2$. After removal of the photoresist shape used to protect portions 1 and 4, from the N well implantation procedure, photoresist shape 9, is formed allowing implantation of boron or $BF_2$ ions into an exposed region of semiconductor substrate 5, in portion 2. The P type implantation, performed at an energy between about 50 to 1000 KeV, at a dose between about 1E12 to 1E15 atoms/$cm^2$, allows formation of $P^+$ region 18, to be accomplished in a top portion of N well region 8, resulting in the desired $P^+$ I/O device. This is schematically shown in FIG. 3. Photoresist shape 9, is removed via plasma oxygen ashing using $CF_4$ as a component of the ashing procedure.

The gate insulator layers and conductive gate structures for both the PMOS and shallow source/drain NMOS device are next addressed and schematically described in FIG. 4. Gate insulator layer 10, an insulator layer such as silicon dioxide, is thermally grown to a thickness between about 5 to 60 Angstroms in an oxygen-steam ambient. A conductive layer such as a doped polysilicon layer is next formed at a thickness between about 500 to 4000 Angstroms, on gate insulator layer 10. A doped polysilicon layer can be obtained via low pressure chemical vapor deposition (LPCVD), doped in situ during deposition via the addition of arsine or phosphine to a silane or disilane ambient. The doped polysilicon can also be obtained via deposition of an intrinsic polysilicon layer followed by implantation of arsenic or phosphorous ions. If desired the conductive layer can be comprised of a metal silicide layer such as tungsten silicide, or comprised of a metal layer such as tungsten. Photoresist shape 19, is next defined and used as an etch mask to allow an anisotropic reactive ion etch (RIE) procedure to define conductive gate structures 11. The anisotropic RIE procedure, using $Cl_2$ as an etchant for polysilicon, selectively terminates at the top surface of gate insulator layer 10. Removal of photoresist shape 19, is accomplished via plasma oxygen ashing including $CF_4$ as a component of the plasma removal procedure. After removal of photoresist shape 19, a post-clean procedure, performed using either a buffered hydrofluoric (BHF) acid or a dilute hydrofluoric (DHF), solution removes the portions of gate insulator layer 10, not protected by conductive gate structure 11. This is schematically shown in FIG. 4.

After definition of the conductive gate structures insulator sidewall spacers 20, can be formed on the sides of the conductive gate structures prior to formation of the MOSFET source/drain region. An insulator layer such as silicon oxide or silicon nitride is deposited via LPCVD or via plasma enhanced chemical vapor deposition (PECVD) procedures, to a thickness between about 500 to 4000 Angstroms. An anisotropic RIE procedure is next performed to selectively define insulator sidewall spacers 20, on the sides of conductive gate structures 11, using $CHF_3$ or $CF_4$ as an etchant. If desired prior to formation of insulator sidewall spacers 20, a lightly doped source/drain (LDD) region can be formed in areas of the semiconductor substrate not covered by conductive gate structures 11. The LDD regions, not shown in the drawings, allow narrower channel lengths to be obtained while also reducing the risk of hot electron injection into the gate insulator layer. Insulator sidewall spacers 20, located on the sides of conductive gate structures 11, are schematically shown in FIG. 5.

Formation of the source/drain regions for the PMOS structure in portion 3, of semiconductor substrate 5, is next addressed and also schematically shown in FIG. 5. Photoresist shape 12, is formed to protect portion 1 (ESD device), portion 2 ($P^+$ I/O device), and portion 4 (shallow source/drain NMOS device), from an ion implantation procedure used to place boron or $BF_2$ ions in the areas of N well region 8, of portion 3 (PMOS), not covered by conductive gate structure 11, or by insulator sidewall spacers 20. The implantation procedure is performed at an energy between about 1 to 50 KeV, at a dose between about 1E12 to 1E16 atoms/$cm^2$. Photoresist shape 12, is then removed, again via plasma oxygen ashing incorporating $CF_4$ as a component of the ashing procedure.

Figure 6:
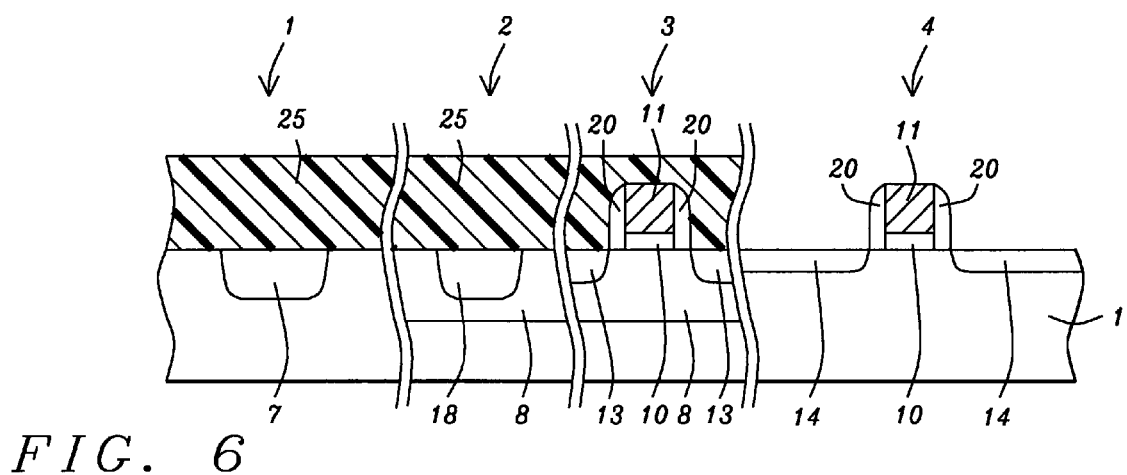

The formation of the shallow source/drain region for the NMOS device in portion 4, of semiconductor substrate 5, is now initiated. Photoresist shape 25, is formed on all portions of semiconductor substrate 5, except on portion 4, allowing shallow source/drain region 14, to be formed in areas of portion 4, not covered by conductive gate structure 11, or by insulator sidewall spacers 20. Shallow source/drain region 14, shown schematically in FIG. 6, is formed via implantation of arsenic ions at an energy between about 5 to 50 KeV, and at a dose between about 1E12 to 1E16 atoms/$cm^2$. The above implantation conditions allow a shallow, N type source/drain region to be realized, however placing the implanted ions near the top surface of semiconductor substrate 5, thus vulnerable to subsequent processing steps. After implantation of the arsenic ions of shallow source/drain region 14, photoresist shape 25, is removed via plasma oxygen ashing procedures. The previous plasma oxygen ashing procedures incorporated $CF_4$ as a valuable component of the ashing procedure allowing complete photoresist removal to be accomplished. However the presence of $CF_4$ in the ashing procedure results in some etching of exposed semiconductor material. For shallow source/drain region of the NMOS device removal of source/drain material would have a greater effect than experienced with deeper diffused or source/drain regions. Therefore to reduce the risk of etching or removal of top portions of shallow source/drain region 14, during the plasma oxygen ashing the flow of $CF_4$ in the plasma asher tool is decreased from between about 50 to 70 sccm, to between about 30 to 50 sccm. In addition a post-photoresist wet clean procedure, employed using ammonium hydroxide-hydrogen peroxide-water (APM) as components, is reduced from between about 4 to 6 min., to between about 0.5 to 1.5 min. The reduced time of the wet clean procedure again limits the exposure of shallow source/drain region 14, to the wet clean procedure thus reducing the risk of etching or removal of a top portion of the shallow source/drain region.

Therefore to allow a shallow source/drain NMOS device to be fabricated as part of an fabrication sequence which also allows integration of other devices such as ESD, I/O and PMOS devices, a specific process sequence as well as specific post-shallow source/drain NMOS steps, have to be employed to prevent disturbing or removing portions of the shallow source/drain region. Therefore the NMOS device featuring the shallow source/drain region, is formed after formation of the other type devices. In addition processes performed after the implantation procedure used for formation of the shallow source/drain region have to be performed at reduced conditions to avoid disturbing or removing portions of the shallow source/drain region.

While this invention has been particularly shown and described with reference to the preferred embodiments thereof, it will be understood by those skilled in the art that various changes in form and details may be made without departing from the spirit or scope of the invention.

What is claimed is:

1. A method of forming a shallow source/drain region of an N channel, metal oxide semiconductor (NMOS) device on a second portion of a semiconductor substrate after other type devices are formed on a first portion of said semiconductor substrate, comprising the steps of:

forming an N well region in a second region, and in a third region of said first portion of said semiconductor substrate;

forming an electro-static discharge (ESD) device in a first region of said first portion of said semiconductor substrate;

forming an input/output device in said second region of said first portion of said semiconductor substrate;

forming a gate insulator layer on said third region of said first portion of said semiconductor substrate, and on said second portion of said semiconductor substrate;

forming conductive gate structures on said gate insulator layer;

forming insulator spacers on sides of said conductive gate structures;

performing a first ion implantation procedure to form P type source/drain regions in area of said third region of said first portion of said semiconductor substrate not covered by a conductive gate structure or by insulator sidewall spacers, resulting in formation of a P channel, metal oxide semiconductor (PMOS) device in said third region of said first portion of said semiconductor substrate;

forming a photoresist shape on said first portion of said semiconductor substrate, with an opening in said photoresist shape exposing said second portion of said semiconductor substrate;

performing a second ion implantation procedure to form an N type, shallow source/drain region in a region of said second portion of said semiconductor substrate not covered by a conductive gate structure or by insulator spacers;

performing a plasma procedure to remove said photoresist shape: and performing a wet clean procedure.

2. The method of claim 1, wherein said gate insulator layer is a silicon dioxide layer, thermally grown at a thickness between about 5 to 50 Angstroms.

3. The method of claim 1, wherein said conductive gate structure comprised of doped polysilicon, is defined at a thickness between about 500 to 4000 Angstroms.

4. The method of claim 1, wherein said conductive gate structure comprised of metal suicide, is defined at a thickness between about 500 to 2000 Angstroms.

5. The method of claim 1, wherein said insulator spacers comprised of silicon oxide, are defined at a thickness between about 500 to 4000 Angstroms.

6. The method of claim 1, wherein said insulator spacers comprised of silicon nitride, are defined at a thickness between about 500 to 4000 Angstroms.

7. The method of claim 1, wherein said second ion implantation procedure used to form said N type, shallow source/drain region, is performed using arsenic ions at an energy between about 5 to 50 KeV, at a dose between about 1E12 to 1E16 atoms/cm$^2$.

8. The method of claim 1, wherein said plasma procedure used to remove said photoresist shape is a plasma oxygen ashing procedure, performed incorporating $CF_4$ at a flow between about 30 to 50 sccm as a component of the plasma oxygen ashing procedure.

9. The method of claim 1, wherein said wet clean procedure is performed using APM (ammonium hydroxide—hydrogen peroxide—water mixture), for a time between about 0.5 to 1.5 mm.

* * * * *

UNITED STATES PATENT AND TRADEMARK OFFICE
CERTIFICATE OF CORRECTION

PATENT NO. : 7,101,748 B2
APPLICATION NO. : 10/788170
DATED : September 5, 2006
INVENTOR(S) : Yu-Lung Yeh et al.

It is certified that error appears in the above-identified patent and that said Letters Patent is hereby corrected as shown below:

Column 6, line 25 in Claim 4, replace "suicide" with --silicide--

Column 6, lines 44-45, replace "hydroxide--hydrogen" with -- hydroxide - hydrogen --.

Column 6, line 45, replace "peroxide--water" with --peroxide - water--

Signed and Sealed this

Twenty-second Day of May, 2007

JON W. DUDAS
*Director of the United States Patent and Trademark Office*